United States Patent [19]
Fukushima

[11] Patent Number: 5,675,397
[45] Date of Patent: Oct. 7, 1997

[54] ELECTRIC CONNECTING STRUCTURE OF DISPLAY EQUIPMENT

[75] Inventor: Kenji Fukushima, Tokyo, Japan

[73] Assignee: NEC Corporation, Tokyo, Japan

[21] Appl. No.: 488,812

[22] Filed: Jun. 9, 1995

[30] Foreign Application Priority Data

Jun. 9, 1994 [JP] Japan .................................. 6-127359

[51] Int. Cl.[6] .................. G02F 1/1333; G02F 1/1345
[52] U.S. Cl. .................. 349/149; 349/151; 349/152; 349/58; 349/74
[58] Field of Search .................. 359/48, 50, 83, 359/88; 313/512; 350/334; 349/149, 151, 152, 58, 74

[56] References Cited

U.S. PATENT DOCUMENTS

| | | | |
|---|---|---|---|
| 4,745,334 | 5/1988 | Kawachi | 313/512 |
| 4,832,455 | 5/1989 | Takeno et al | 350/334 |

FOREIGN PATENT DOCUMENTS

| | | | |
|---|---|---|---|
| 0 558 855 | 9/1993 | European Pat. Off. . | |
| 468327 | 3/1992 | Japan . | |
| 6-011718 | 1/1994 | Japan | 359/83 |
| 1 443 338 | 7/1976 | United Kingdom . | |
| 1 488 301 | 10/1977 | United Kingdom . | |
| 1 568 821 | 6/1980 | United Kingdom . | |
| 2 061 569 | 5/1981 | United Kingdom . | |
| 2 108 307 | 5/1983 | United Kingdom . | |

OTHER PUBLICATIONS

Patent Abstracts of Japan, Section P:P–856, vol. 13, No. 152, p. 53 & JP 63-313129.

*Primary Examiner*—William L. Sikes
*Assistant Examiner*—Julie Ngo
*Attorney, Agent, or Firm*—Scully, Scott, Murphy & Presser

[57] ABSTRACT

Display equipment with exposed electrodes formed for establishing an electric connection with each of liquid crystal display, an electroluminescent light and a printed board. Anisotropic, electrically conductive elastomer pieces are placed between the respective exposed electrodes of the printed board, the liquid crystal display section and the electroluminescent light. A pressing rubber piece is placed on the side of the electroluminescent light which is opposite to its electrode side, and the component parts are received in and held by a holding frame which houses them from above the liquid crystal display section. Bent tip portions are inserted into the printed board and bent to fix the printed board and the holding frame. The electrode section of the electroluminescent light is pressed by the window head jump of the holding frame via the pressing rubber piece and is connected electrically in a stable manner. Even in cases where the liquid crystal display equipment has an electric connection section with a multilayer structure, the productivity may be increased since no solder is used. Arrangement of an anisotropic, electrically conductive member across the cut created by the removal allows establishment of an electric connection between non-adjacent electric circuit boards. If necessary, a plurality of such anisotropic, electrically conductive members may be arranged by mounting them on an insulating board which is then inserted between the electric circuit boards to be electrically connected.

11 Claims, 4 Drawing Sheets

5,675,397

ELECTRIC CONNECTING STRUCTURE OF DISPLAY EQUIPMENT

BACKGROUND OF THE INVENTION

1. Field of the Invention

The present invention relates to display equipment, and particularly to a board structure comprising a liquid crystal display section, an electric circuit board which processes a signal to the display section, etc.

2. Description of Related Art

Liquid crystal display equipment has come into widespread usage, such as in mobile portable phones, portable electronic computers, liquid crystal television sets and the like.

Liquid crystal display equipment is usually constructed with a liquid crystal display section and an electric circuit board which sends a requisite signal to the liquid crystal display section. Furthermore, the liquid crystal display section has a planar illumination section on its back side so that the display contents are visible even in the dark. For miniaturization, liquid crystal display equipment usually has the illumination section on the back side of the liquid crystal display section, and these are placed over the electric circuit board which drives the liquid crystal display section. According to the prior art, the liquid crystal display section and illumination section are arranged in an electric circuit and fixed by soldering in order to establish an electric connection between the electrode sections. Soldering, however, presents the problem of rather prolonged assembling times which result in lower productivity. In addition, heat must be applied to the solder joint sections, and this presents the additional problem of thermal influence upon peripheral equipment such as the illumination section.

As a solution to the above problems due to soldering, Japanese Laid-open Patent Application HEI 4-67126 discloses a configuration which involves establishment of a connection between the electrodes of a liquid crystal cell and an electric circuit board via an anisotropic, electrically conductive film. Also, Japanese Unexamined Patent Application Disclosure HEI 4-68327 discloses a configuration wherein the connecting terminals of an electric circuit board and a liquid crystal display section are crimped by the use of the elastic force of a crimping rubber piece.

Importantly, however, all the liquid crystal display equipment has the extraction electrode of the illumination section and the electrode section of the electric circuit board connected by soldering. Three or more-layer configurations comprising a liquid crystal display section, an illumination section, an electric circuit board, etc. which need to be connected electrically present difficulties in establishing connections without soldering. Accordingly, even if two layers may be connected electrically without soldering, the problem of lower productivity still remains. The productivity of display equipment comprising an illumination section in addition to a liquid crystal display section and an electric circuit board, or one comprising a multilayer circuit board cannot be increased even if establishment of connections by soldering is completely avoided.

SUMMARY OF THE INVENTION

It is an object of the present invention to provide display equipment which allows establishment of an electric connection and assembling, in a manner entirely free of soldering, even between boards which constitute a multilayer structure, including a display section, a driving circuit board for sending a signal, an illumination section for illuminating the display section, etc.

The display equipment of the present invention is equipped with display means with an enclosure electrode mounted thereon which receives a driving signal, and a light emitter provided with an exposed electrode for receiving electric power for illumination of the display contents on the display from its back side. The display equipment of the present invention may also comprise a circuit board with an exposed electrode formed thereon which drives the display section and the light emitter, a first anisotropic, electrically conductive material which electrically connects the exposed electrode of the circuit board and the exposed electrode of the display, and a second anisotropic, electrically conductive material which electrically connects the exposed electrode of the circuit board and the exposed electrode of the light emitter. The display equipment of the present invention is characterized by an electric connection established by an anisotropic, electrically conductive material between display means, a light emitter and a circuit board which have a layered structure. In addition, the display means has an open structure type frame. This open structure type frame allows efficient exertion of pressure on the first anisotropic, electrically conductive material and the second anisotropic, electrically conductive material. As a result, an electric connection may be established between multilayered boards.

Accordingly, the display equipment of the present invention has a layered structure with exposed electrodes formed for establishing an electric connection with each of the display, the light emitter and the circuit board. The anisotropic, electrically conductive material may electrically connect the exposed electrode of the circuit board, the exposed electrode of the liquid crystal and the exposed electrode of the light emitter. Therefore, multilayer structures may also undergo establishment of a reliable, electrically conductive connection in a manner entirely free of soldering.

In addition, in the case of multilayered electric circuit boards, an intervening electric circuit board is partially removed. Arrangement of an anisotropic, electrically conductive material across the cut created by the removal allows establishment of an electric connection between nonadjacent electric circuit boards. If necessary, a plurality of such anisotropic, electrically conductive materials may be arranged by mounting them on an insulating board which is then inserted between the electric circuit boards to be electrically connected.

BRIEF DESCRIPTION OF THE DRAWINGS

The above and other objects, features and advantages of the present invention will become more apparent from the following detailed description when taken in conjunction with the accompanying drawings, wherein.

DETAILED DESCRIPTION OF THE PREFERRED EMBODIMENTS

First, prior to the explanation of the configuration of the display equipment of the present invention, the configuration of the display equipment of the prior art will be explained in order to facilitate understanding of the present invention.

Figure 1:
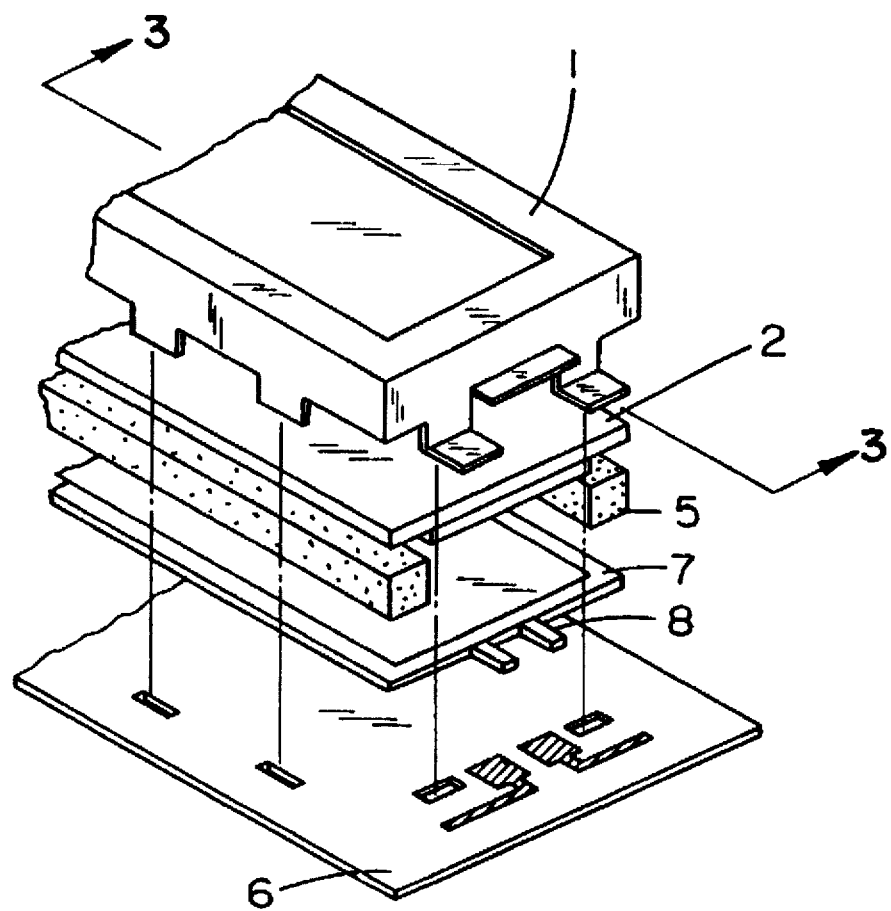
FIG. 1 is a view illustrative of an instance of prior art display equipment.

FIG. 1 illustrates the configuration of conventional display equipment as an instance of liquid crystal display equipment. In this instance of liquid crystal display equipment, an electric connection is established between a liquid crystal display section 2 and a printed board 6 via an anisotropic, electrically conductive elastomer piece 5. In addition, the back side of the liquid crystal display section 2 is provided with an electroluminescent light 7 for illumination. An electroluminescent light extraction electrode 8 provided for this electroluminescent light 7 is connected by soldering with an electrode pattern for a driving signal which is formed on the printed board 6.

All these connection parts are fixed with a holding frame 1 and the printed board 6. The portion of the holding frame 1 which corresponds to the solder joint portion of the electroluminescent light extraction electrode 8 and the electrode pattern for a driving signal is formed as an opened section by partially bending a side of the frame outward.

In liquid crystal display equipment of the prior art, the connection between the extraction electrode 8 of the illumination section and the electrode section of the printed board 6 must be established by soldering. With the prior art connection structure which uses an anisotropic, electrically conductive film, an electric connection may be established between only two layers, for example, between a liquid crystal display section and an electric circuit board. This naturally leads to the problem of lowered productivity. Thus, the prior art cannot handle liquid crystal display sections equipped with an illumination section and further with a multilayer drive board for processing signals.

Figure 2:
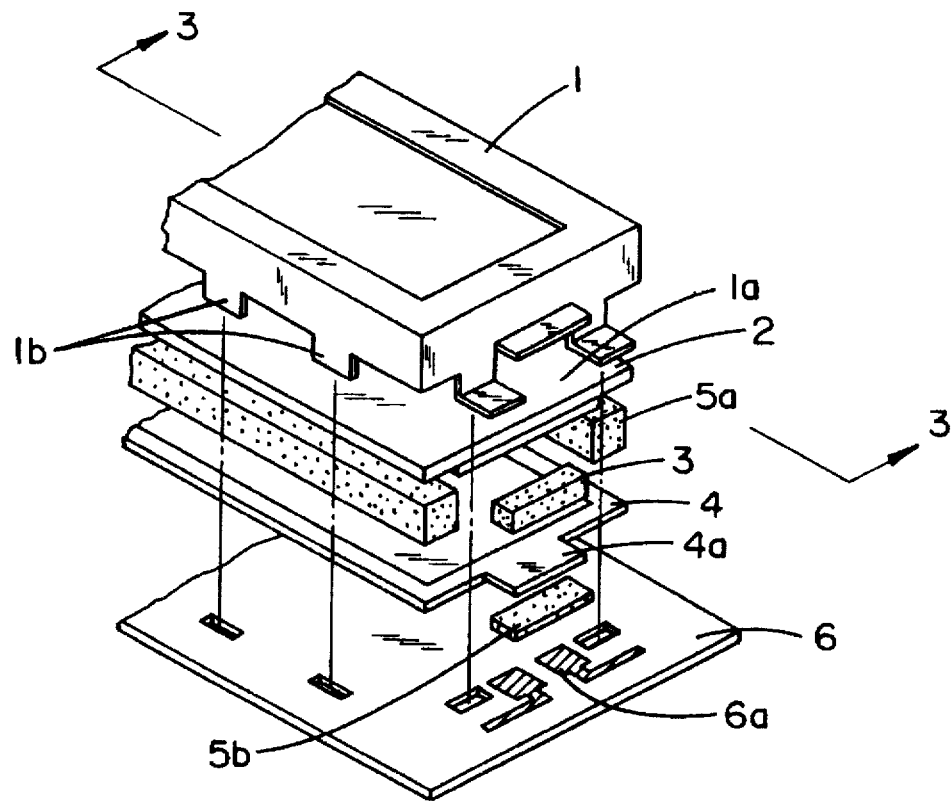
FIG. 2 is a view illustrating the configuration of a first embodiment of the display equipment of the present invention which is implemented as a liquid crystal display equipment.
Figure 3:
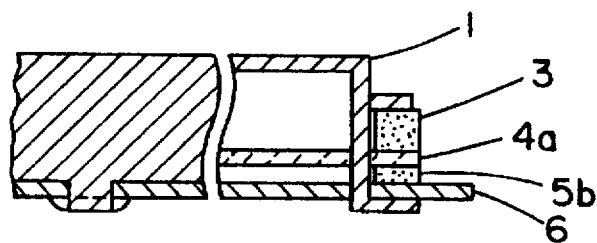
FIG. 3 is a partial, cross sectional view taken on line 3—3 in FIG. 2.

An embodiment of the liquid crystal display equipment according to the present invention will be explained with reference to FIGS. 2 and 3. FIG. 2 is a view illustrative of how an embodiment of the liquid crystal display equipment of the present invention is assembled. FIG. 3 is a cross sectional view taken on line 3—3 in FIG. 3. The present embodiment is assembled by layering respective component parts, which make up an electroluminescent light 4 and a liquid crystal display section 2, on a printed board 6 as the base plate. An open structure type holding frame 1 houses these parts from above and is fixed.

Also, the drive circuit-mounted printed board 6 is electrically connected with the liquid crystal display section 2 and with the electroluminescent light 4 through anisotropic, electrically conductive elastomer pieces 5a and 5b, respectively.

The holding frame 1 is the frame which holds the liquid crystal display equipment mechanically. This frame holds the component parts against external forces exerted on the liquid crystal display equipment, and further plays a role in stabilizing the connections between the component parts. In order to ensure these functions, the holding frame 1 is formed with a box structure. Also, an opening section for display is formed in the top surface, with a frame formed by the four sides of the box. One of the four sides is provided with a window 1a for protection and prevention of shorting of the electrode section of the electroluminescent light 4. In addition, the frame is provided, at its important points, with a plurality of bent tip portions 16 for mechanical fixation to the printed board 6.

The liquid crystal display section 2 comprises a device which presents a visible display by change in arrangement of the molecules upon application of a voltage. The electrode section for a driving signal is exposed and capable of being connected electrically by its contact with the anisotropic, electrically conductive elastomer piece 5b.

The pressing rubber piece 3 is a buffer which produces an appropriate pressure which is enough to establish stable electric connections between the electrode 4a of the electroluminescent light, the anisotropic, electrically conductive elastomer piece 5b and the electrode 6a of the printed board. A rubber piece is employed as the buffer according to the present embodiment. A spring or the like may also be used as well as a rubber piece.

The electroluminescent light 4 is a light emitter. This is a so-called backlight to enhance the contrast of the display on the liquid crystal display section 2. The electroluminescent light 4 is provided with an electrode section 4a for receiving driving power for illumination. This electrode section 4a is formed in an exposed state and is capable of being connected electrically by its contact with the anisotropic, electrically conductive elastomer piece 5b.

The anisotropic, electrically conductive elastomer pieces 5 are highly elastic bodies made of an anisotropic, electrically conductive material with high electric conductivity only in a specific direction. The anisotropic, electrically conductive elastomer piece 5a according to the present embodiment has a layered structure of electrically conductive materials arranged with small pitches so as to transmit a plurality of liquid crystal driving signals from the printed board 6 to the liquid crystal display section 2. Also, the anisotropic, electrically conductive elastomer piece 5b transmits electroluminescent light driving power from the printed board 6 to the electroluminescent light 4. By contacting the two end faces of the laminate of electrically conductive materials with the two exposed electrodes, respectively, an electric connection may be established between the two electrodes.

These parts allow establishment of a stable electric connection between the printed board 6 and the electroluminescent light 4. The electroluminescent light 4, the anisotropic, electrically conductive elastomer piece 5b and the printed board 6 are pressed from above by the holding frame 1 via the intervening pressing rubber piece 3. Since the pressing rubber piece 3 is housed in the window 1a surrounded by the holding frame 1, the top surface of the rubber piece 3 is pressed down.

According to the liquid crystal display equipment of the present invention, electric connections may be established separately between the printed board 6, the liquid crystal display section 2 and the electroluminescent light 4. Also, the pattern configuration of the prior art printed board and the structure of the holding frame 1 may be used here directly, or equivalently, without being modified. Since no solder is used for establishing an electric connection between the printed board and the electroluminescent light, the productivity is increased. Inspection for maintenance is facilitated since disengaging of the open structure type holding frame 1 from the printed board 6 results in loosening of all the component parts of the liquid crystal display equipment (the liquid crystal display section 2, the electroluminescent light 4 and the anisotropic, electrically conductive elastomer pieces 5a and 5b).

Figure 4:
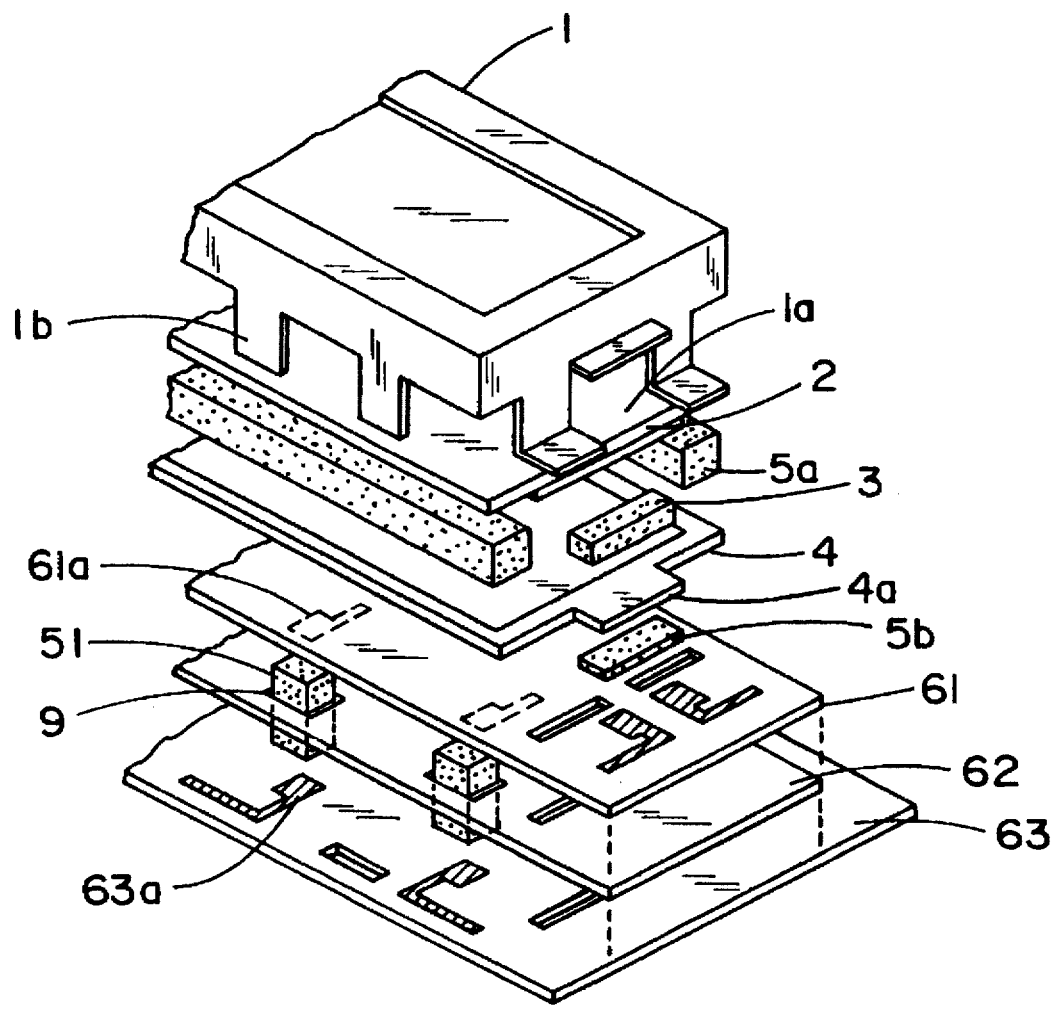
FIG. 4 is a view illustrative of a second embodiment of the display equipment of the present invention.

An explanation will now be given regarding an embodiment wherein the driving circuit board or the like which is connected to the liquid crystal display section and the electroluminescent light are multilayered. FIG. 4 is an instance of a three-layer configuration consisting of printed boards 61, 62 and 63 which drive the liquid crystal display section 2. This embodiment is assumed to involve connection between the exposed electrodes 61a and 63a mounted on the printed boards 61 and 63, respectively.

In the case of prior art configurations, establishment of electric connections between such multilayered printed boards requires installation of aerially connected wiring from the electrodes. Connection of wires naturally involves soldering. In addition, spaces for wiring are required, and this prevents downsizing. Contrary, according to the present invention, in cases where an electric connection is attempted to be established between the non-adjacent printed boards 61 and 63, all that is needed is removal of part of the printed board 62 lying between the two boards and placement of an anisotropic, electrically conductive elastomer piece 51 in the cut 9 created by the removal.

Figure 5:
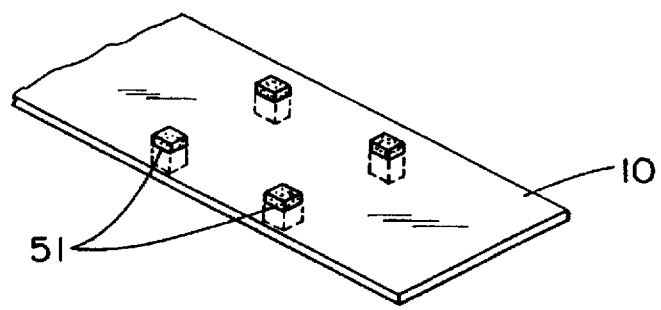
FIG. 5 is a view illustrative of a connecting board which is used in an application of the second embodiment.
Figure 6:
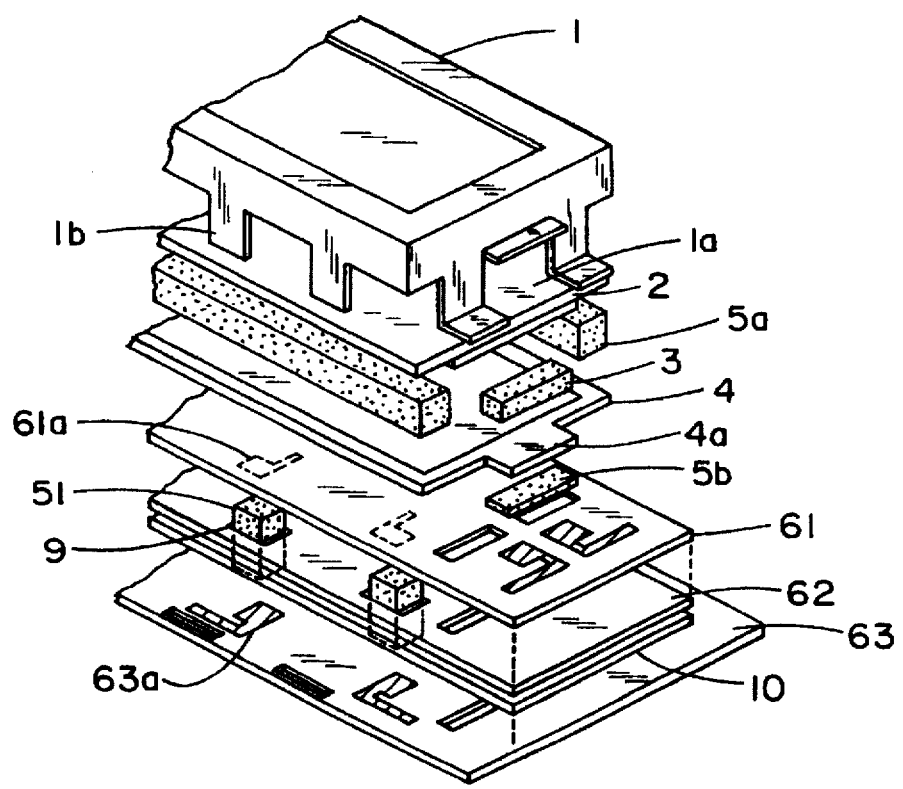
FIG. 6 is a view illustrative of the application of the second embodiment which uses the connecting board shown in FIG. 5.

In addition, in cases where electric connections are being established at a plurality of points, as shown in FIG. 5, a connecting board 10 may be used which comprises anisotropic, electrically conductive elastomer pieces positioned beforehand at given points on an insulating board. As shown in FIG. 6, this connecting board 10 may be placed between the printed boards 61 and 62, or 62 and 63 (not shown). Here, the cut remaining after the partial removal of the printed board 62 may be a hole or a notch cut in the perimeter of the board. Although the foregoing explanation was focused on a printed board with a three-layer structure, the present invention may also be applied to printed boards having more layers.

Connection between the printed boards was explained with reference to the above embodiment. A direct electric connection between the display section and the electric circuit board of a three-layer structure consisting of a display section, an illumination section and an electric circuit board may be established by application of the configuration of the display equipment of the present invention. The above-described configuration is also effective to directly connect the electrode of a printed board having a driving circuit for the display section, with the electrode of the display section, for example.

As explained above, display equipment of the present invention allows electric connection and assembling without using solder, even if the display equipment has a multilayer structure of printed boards provided with a display section, an illumination section and many driving circuits in addition. Omission of soldering contributes to increased productivity and easier maintenance due to ready disengagement of the component parts.

While the present invention has been described in connection with certain preferred embodiments, it is to be understood that the subject matter encompassed by the present invention is not limited to those specific embodiments. On the contrary, it is intended for the subject matter of the present invention to include all alternatives, modifications and equivalents as can be included within the spirit and the scope of the following claims.

What is claimed is:

1. Display equipment comprising:

display means which receives an electric signal and displays display contents on a display section, said display contents depending on said electric signal;

illumination means having a first electrode for receiving electric power, said illumination means illuminating said display section;

a circuit board having a second electrode, said circuit board forming a multilayer structure together with said display means and said illumination means, wherein said circuit board sends said electric signal to said display means, and provides said electric power to said illumination means;

a first electrically conductive elastomer member which is separable from said display means and said illumination means, wherein said first electrically conductive elastomer member electrically connects said display means and said illumination means without soldering;

a second electrically conductive elastomer member which is separable from said first and second electrodes and electrically connects said first and second electrodes; and an open structure type holding frame which houses said display means, said illumination means and said circuit board from above a top surface of the display equipment.

2. Display equipment as claimed in claim 1, wherein said first electrically conductive member and said second electrically conductive material are anisotropic, electrically conductive materials.

3. Display equipment as claimed in claim 2, wherein said display means is liquid crystal display equipment.

4. Display equipment as claimed in claim 3, wherein said illumination means is an electroluminescent light.

5. Display equipment as claimed in claim 1, wherein said circuit board has a hole, and said holding frame has a protruding portion which fits in said hole.

6. Display equipment comprising:

a first board having a first electrode which is capable of establishing at least one electric connection;

a second board placed on said first board in an overlaid state; and a third board placed on said second board in an overlaid state, said third board having a second electrode which is capable of establishing at least one electric connection, wherein said second board has a cut created by removal of at least one portion thereof which faces said first and second electrodes, and wherein said display equipment further comprises an electrically conductive elastomer material arranged through said cut to establish an electric connection between said first and second electrodes without soldering.

7. Display equipment as claimed in claim 6, wherein said electrically conductive material is an anisotropic, electrically conductive material.

8. Display device as claimed in claim 6, which further comprises:

display means for displaying display contents on the display section which depend on said electric signal; and illumination means for illuminating said display section.

9. Display equipment as claimed in claim 6, wherein said electrically conductive material is arranged through a connecting board which is overlaid on said second board.

10. Display equipment as claimed in claim 6, wherein said cut is a hole.

11. Display equipment as claimed in claim 7, wherein said cut is a notch formed on the perimeter of said second board.

* * * * *

UNITED STATES PATENT AND TRADEMARK OFFICE
CERTIFICATE OF CORRECTION

PATENT NO. : 5,675,397
DATED : October 7, 1997
INVENTOR(S) : Kenji Fukushima

It is certified that error appears in the above-identified patent and that said Letters Patent is hereby corrected as shown below:

Column 3, line 48: "FIG. 3" should read --FIG. 2--

Column 4, line 4: "portions 16" should read --portions 1b--

Signed and Sealed this

Fifth Day of January, 1999

Attest:

Attesting Officer

*Acting Commissioner of Patents and Trademarks*